US009696751B2

United States Patent
Ueda et al.

(10) Patent No.: US 9,696,751 B2
(45) Date of Patent: Jul. 4, 2017

(54) SUBSTRATE WITH TRANSPARENT ELECTRODE, METHOD FOR MANUFACTURING SAME, AND TOUCH PANEL

(71) Applicant: KANEKA CORPORATION, Osaka-shi, Osaka (JP)

(72) Inventors: Hiroaki Ueda, Otsu (JP); Kozo Kondo, Otsu (JP); Kazuhisa Danno, Otsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 58 days.

(21) Appl. No.: 14/401,495

(22) PCT Filed: Jan. 29, 2013

(86) PCT No.: PCT/JP2013/051831
§ 371 (c)(1),
(2) Date: Nov. 14, 2014

(87) PCT Pub. No.: WO2013/172055
PCT Pub. Date: Nov. 21, 2013

(65) Prior Publication Data
US 2015/0145816 A1   May 28, 2015

(30) Foreign Application Priority Data
May 17, 2012  (JP) .................. 2012-113242

(51) Int. Cl.
*G06F 1/16*   (2006.01)
*C23C 14/34*   (2006.01)
(Continued)

(52) U.S. Cl.
CPC .......... *G06F 1/16* (2013.01); *C23C 14/0036* (2013.01); *C23C 14/08* (2013.01); *C23C 14/083* (2013.01);
(Continued)

(58) Field of Classification Search
CPC .. B32B 7/02; B32B 27/08; B32B 7/12; B32B 2255/10; B32B 2255/20; B32B 2255/26;
(Continued)

(56) References Cited

U.S. PATENT DOCUMENTS 6,399,222 B2 * 6/2002 Arai .................. H01L 51/5253
313/504
7,820,138 B2 * 10/2010 Watanabe .............. B82Y 30/00
423/594.9

(Continued)

FOREIGN PATENT DOCUMENTS

CN       101566903 A     10/2009
CN       102298985 A     12/2011
(Continued)

OTHER PUBLICATIONS

Thickness dependence of the properties of indium tin oxide (ITO) Films prepared by activated reactive evaporation M.D. Benoy et al. Brazilian Journal of Physics, vol. 39, No. 4, Dec. 2009.*
(Continued)

*Primary Examiner* — Michael F McAllister
(74) *Attorney, Agent, or Firm* — Alleman Hall Creasman & Tuttle LLP

(57) ABSTRACT

A substrate is provided with a transparent electrode in which the pattern is hardly visible even when the transparent electrode layer has been patterned, and a method for manufacturing thereof is provided. On at least one of the surfaces of a transparent film, a first, second, and third dielectric material layer, and a patterned transparent electrode layer are included, in this order, each preferably having a film thickness and refractive index within a specific range. The first and third dielectric material layers are silicon oxide layers containing $SiO_x$ and $SiO_y$ as main components, respectively. The second dielectric material layer is a metal oxide layer containing a metal oxide. The transparent elec-
(Continued)

trode layer is a conductive metal oxide layer containing an indium-tin composite oxide as a main component. The refractive indexes of the first ($n_1$), second ($n_2$), and third ($n_3$) dielectric material layers satisfy the relationship $n3<n1<n2$.

10 Claims, 2 Drawing Sheets

(51) Int. Cl.
*C23C 14/08* (2006.01)
*G06F 3/044* (2006.01)
*C23C 14/10* (2006.01)
*C23C 14/00* (2006.01)
*C23C 14/35* (2006.01)
*C23C 14/56* (2006.01)

(52) U.S. Cl.
CPC ............ *C23C 14/086* (2013.01); *C23C 14/10* (2013.01); *C23C 14/34* (2013.01); *C23C 14/35* (2013.01); *C23C 14/562* (2013.01); *G06F 3/044* (2013.01); *G06F 2203/04103* (2013.01); *G06F 2203/04112* (2013.01)

(58) Field of Classification Search
CPC .......... B32B 2255/28; B32B 2307/202; B32B 2307/412; B32B 2457/16; B32B 2457/208; B32B 2509/00; G06F 3/044; H03K 17/962; Y10T 428/24942
USPC .......................................... 428/212; 438/652
See application file for complete search history.

(56) References Cited

U.S. PATENT DOCUMENTS

| | | | | |
|---|---|---|---|---|
| 8,747,959 B2* | 6/2014 | Krasnov | ............ | H01L 31/1884 427/255.19 |
| 9,305,680 B2* | 4/2016 | Yamazaki | ............ | C23C 14/024 |
| 2004/0118332 A1* | 6/2004 | Tadakuma | .......... | C23C 18/1216 117/2 |
| 2009/0091835 A1* | 4/2009 | Wakizaka | .............. | G02B 1/115 359/586 |
| 2010/0003502 A1 | 1/2010 | Nashiki et al. | | |
| 2010/0013784 A1* | 1/2010 | Nashiki | ................... | C23C 14/08 345/173 |
| 2010/0026180 A1* | 2/2010 | Kobayashi | .......... | H01L 51/5265 313/506 |
| 2010/0127611 A1* | 5/2010 | Imura | ..................... | C23C 14/08 313/326 |
| 2011/0217548 A1* | 9/2011 | Nashiki | ..................... | B32B 7/02 428/339 |
| 2011/0318553 A1* | 12/2011 | Lotz | ........................ | C23C 14/34 428/212 |
| 2012/0114919 A1* | 5/2012 | Nakajima | ............... | G06F 3/044 428/203 |
| 2013/0005139 A1* | 1/2013 | Krasnov | ............. | G02F 1/13439 438/652 |
| 2013/0280554 A1* | 10/2013 | Yamazaki | ............. | C23C 14/024 428/697 |
| 2014/0232951 A1 | 8/2014 | Ueda et al. | | |

FOREIGN PATENT DOCUMENTS

| | | |
|---|---|---|
| CN | 103443748 A | 12/2013 |
| JP | 2008275737 A | 11/2008 |
| JP | 2010-015861 * | 1/2010 |
| JP | 2010015861 A | 1/2010 |
| JP | 2010021048 A | 1/2010 |
| JP | 201023282 A | 2/2010 |
| JP | 2010069675 A | 4/2010 |
| JP | 2010184477 A | 8/2010 |
| WO | 2011048648 A1 | 4/2011 |

OTHER PUBLICATIONS

Near-infrared transparent electrodes for precision Teng-Man electro-optic measurements: In2O3 thin-film electrodes with tunable near-infrared transparency Lian Wang 2005 et al. Applied Physics Letters 87, 161107 2005.*

ISA Japanese Patent Office, International Search Report Issued in Application No. PCT/JP2013/051831, Apr. 23, 2013, WIPO, 4 pages.

International Bureau of WIPO, International Preliminary Report on Patentability Issued in Application No. PCT/JP2013/051831, Nov. 27, 2014, 5 pages.

* cited by examiner

SUBSTRATE WITH TRANSPARENT ELECTRODE, METHOD FOR MANUFACTURING SAME, AND TOUCH PANEL

TECHNICAL FIELD

The invention relates to a substrate with a transparent electrode which is suitably used for a touch panel, and a manufacturing method thereof. The invention also relates to a touch panel having a substrate with a transparent electrode.

BACKGROUND ART

A substrate with a transparent electrode, in which a transparent electrode layer is formed on a transparent substrate such as a film or glass, is used as a transparent electrode of a display of a touch panel, light-emitting device, photoelectric conversion device or the like. When a substrate with a transparent electrode is used for position detection of a capacitance touch panel, the transparent electrode layer is finely patterned. As a patterning method, for example, a method is used in which, after a transparent electrode layer is formed substantially over the entire surface of a transparent substrate, the transparent electrode layer is removed by etching or the like in a part of the plane. In this way, a substrate with a transparent electrode can be obtained in which a transparent electrode layer patterned into an electrode layer-formed part (also referred to as a "non-etched part") and an electrode layer-non-formed part (also referred to as an "etched part") is formed on a substrate.

For clearly displaying an image on a display, it is important to improve the transparency of the substrate with a transparent electrode. Further, in the substrate with a transparent electrode, in which the transparent electrode layer is patterned, it is required that the pattern of the transparent electrode layer be hardly visible.

For example, Patent Documents 1 and 2 propose a substrate with a transparent electrode in which a transparent electrode layer is formed on a transparent film with two transparent dielectric material layers interposed therebetween. Patent Document 1 proposes that, by setting the thickness and refractive index of each transparent dielectric material layer to specific values, a difference in transmittance and a Ab* between an electrode layer-formed part and an electrode layer-non-formed part are reduced. Patent Document 2 proposes that, by setting the thickness and refractive index of each transparent dielectric material layer to specific values, a difference in reflectance between an electrode layer-formed part and an electrode layer-non-formed part is reduced to suppress pattern visibility.

Patent Documents 3 and 4 disclose that a substrate with a transparent electrode, which includes three thin film layers having a specific thickness and a specific refractive index between a transparent film and a transparent electrode, has a high transmittance and has transmitted light b* in a specific range and thus is suitable for a resistive touch panel substrate. However, the visibility of a pattern when the transparent electrode layer is patterned was not discussed in Patent Documents 3 and 4.

PRIOR ART DOCUMENTS

Patent Documents

Patent Document 1: JP-A-2010-15861
Patent Document 2: JP-A-2010-23282
Patent Document 3: JP-A-2010-184477
Patent Document 4: JP-A-2010-69675

SUMMARY OF THE INVENTION

Problems to be Solved by the Invention

The inventors conducted studies and found that, in a substrate with a transparent electrode in which a transparent electrode layer was patterned, the pattern could be visible even when a difference in transmittance between an electrode layer-formed part and an electrode layer-non-formed part and Ab* were reduced. In view of the problem of pattern visibility, the inventors further conducted studies, and resultantly found that a substrate with a transparent electrode, which has a patterned transparent electrode layer, had creases along the pattern of the transparent electrode layer, and light was reflected in conformity with the shape of creases, so that the pattern tended to be easily visible.

The present inventors patterned a transparent electrode layer of a substrate with a transparent electrode including three thin film layers as disclosed in Patent Documents 3 and 4, and checked the visibility of the substrate with a transparent electrode, and resultantly found that creases were generated along the pattern of the transparent electrode layer, so that the patter was visible.

In view of the above-mentioned situations, an object of the present invention is to provide a substrate with a transparent electrode in which the generation of creases along a pattern of a transparent electrode layer is inhibited, so that the pattern is hardly visible. Further, an object of the present invention is to provide a substrate with a transparent electrode in which an ITO film having a low resistance is formed on a transparent film substrate.

Means for Solving the Problems

The inventors have conducted studies and resultantly found that, when a transparent dielectric material layer having a specific refractive index and a specific thickness is provided between a transparent film and a transparent electrode layer, and the transparent electrode layer has a specific refractive index and a specific resistivity, the pattern visibility of the transparent electrode layer is suppressed. Further, the present inventors have conducted studies and resultantly found that a transparent electrode layer with specific characteristics has a low resistance. Further, the inventors have found that, in a substrate with a transparent electrode in which the transparent electrode layer having a low resistance is formed on the dielectric material layer, the pattern of the transparent electrode layer is hardly visible.

The present invention relates to a substrate with a transparent electrode, which has on at least one of the surfaces of a transparent film a transparent dielectric material layer containing an oxide as a main component, and a transparent electrode layer in this order, and a method for manufacturing thereof.

In a preferable embodiment, the transparent dielectric material layer includes a first dielectric material layer, a second dielectric material layer and a third dielectric material layer in this order from the transparent film side. The first dielectric material layer is a silicon oxide layer containing an $SiO_x$ ($x \geq 1.5$) as a main component. The second dielectric material layer is a metal oxide layer containing as a main component at least one oxide of a metal selected from the group consisting of Nb, Ta, Ti, Zr, Zn and Hf. The third dielectric material layer is a silicon oxide layer containing an $SiO_y$ (y>x) as a main component. The transparent electrode layer is a conductive metal oxide layer containing an indium-tin composite oxide as a main component. The second dielectric material layer is preferably a metal oxide layer containing $Nb_2O_5$ as a main component.

In a substrate with a transparent electrode according to the present invention, it is preferable that the first dielectric material layer has a thickness of 1 nm to 25 nm, the second dielectric material layer has a thickness of 5 nm or more and less than 10 nm, the third dielectric material layer has a thickness of 35 nm to 80 nm, and the transparent electrode layer has a thickness of 20 nm to 35 nm. Specifically, the thickness of the third dielectric material layer is preferably more than 55 nm and not more than 80 nm, in the viewpoint of effectively inhibiting the generation of creases along the pattern of the transparent electrode layer. The refractive index $n_1$ of the first dielectric material layer, the refractive index $n_2$ of the second dielectric material layer and the refractive index $n_3$ of the third dielectric material layer preferably satisfy the relationship of $n_3<n_1<n_2$. In addition the refractive index $n_4$ of the transparent electrode layer is preferably larger than the refractive index $n_1$ of the first dielectric material layer and smaller than the refractive index $n_2$ of the second dielectric material layer. Specifically, the relationship of $n_3<n_1<n_4<n_2$ is preferable.

The transparent electrode layer preferably has a resistivity of $5.0\times10^{-4}\Omega\cdot cm$ or less. In addition, the transparent electrode layer preferably has a refractive index of 1.88 or less. For the resistivity and the refractive index to fall within the above-mentioned range, the content of tin oxide in the transparent electrode layer is preferably 4 parts by weight to 14 parts by weight based on 100 parts by weight of the sum of indium oxide and tin oxide. In order to obtain a transparent electrode layer which is easy to crystallize and has low resistivity, tin oxide content in the transparent electrode layer is preferably 8 parts by weight or less.

In an embodiment of the present invention, the transparent electrode layer is patterned into an electrode layer-formed part and an electrode layer-non-formed part. The electrode layer-formed part of the substrate with a transparent electrode preferably has a transmittance of 87% or more.

In order to obtain a transparent electrode layer with low resistivity, an arithmetic mean roughness Ra of the third dielectric material layer is preferably 1 nm or less. Preferably, the third dielectric material layer is formed under a pressure of less than 0.4 Pa by a sputtering method to form the above-mentioned surface shape. Preferably, the first dielectric material layer is also formed under a pressure of less than 0.4 Pa by a sputtering method.

In a preferable embodiment of the present invention, the indium-tin composite oxide in the transparent electrode layer has an average crystal grain size of 110 nm to 700 nm. In addition, a variation coefficient of the crystal grain size is 0.35 or more. When the transparent electrode layer has these crystalline properties, resistivity thereof may be reduced and a transparent electrode layer having a resistivity of $3.7\times10^{-4}\Omega\cdot cm$ or less may be obtained.

Such a transparent electrode layer with low resistivity is preferably manufactured by the following method: an amorphous transparent electrode layer containing indium-tin composite oxide as a main component is deposited on a transparent film substrate by a sputtering method with a magnetic flux density of a surface of a target that is 30 mT or more; and then the amorphous transparent electrode is crystalized.

Further, the present invention relates to a capacitance touch panel including the above mentioned substrate with a transparent electrode.

Effects of the Invention

A substrate with a transparent electrode according to the present invention includes a transparent dielectric material layer having a specific refractive index and a specific thickness between a transparent film and a transparent electrode layer. The substrate with a transparent electrode can contribute to the improvement of visibility when used for a capacitance touch panel because, when the transparent electrode layer is patterned, generation of creases along the pattern of the transparent electrode layer is inhibited, so that the pattern is hardly visible.

When the transparent electrode layer has a specific crystal grain size, the transparent electrode layer has a further reduced resistance and the generation of creases along the pattern of the transparent electrode layer is further reduced. Accordingly, a capacitance touch panel which is further excellent in visibility and response speed can be provided.

DESCRIPTION OF EMBODIMENTS

[Configuration of Substrate with Transparent Electrode]

Figure 1:
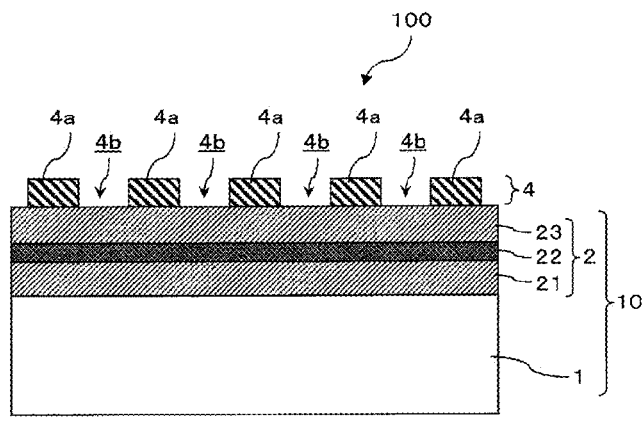
FIG. 1 is a schematic sectional view of a substrate with a transparent electrode according to one embodiment.

Preferred embodiments of the present invention will be described below with reference to the drawings. FIG. 1 is a schematic sectional view showing a substrate with a transparent electrode according to one embodiment of the present invention. In FIG. 1, the substrate 100 with a transparent electrode includes a transparent dielectric material layer 2 consisting of three layers, which are a first dielectric material layer 21 having a refractive index $n_1$, a second dielectric material layer 22 having a refractive index $n_2$, a third dielectric material layer 23 having a refractive index $n_3$, and a transparent electrode layer 4 having a refractive index $n_4$, in this order on a transparent film 1. In FIG. 1, the transparent electrode layer 4 is patterned into an electrode layer-formed part 4a and an electrode layer-non-formed part 4b. This substrate with a transparent electrode is formed by, for example, depositing the first dielectric material layer 21, the second dielectric material layer 22, the third dielectric material layer 23 and the transparent electrode layer 4 on the transparent film 1, and then patterning the transparent electrode layer 4 by etching or the like.

(Transparent Film)

The material of the transparent film 1 is not particularly limited as long as it is colorless and transparent at least in a visible light region, and is heat resistant at a transparent electrode layer deposition temperature. Example materials of the transparent film include polyester resins such as polyethylene terephthalate (PET), polybutylene terephthalate (PBT) and polyethylene naphthalate (PEN), a cycloolefin-based resin, a polycarbonate resin, a polyimide resin and a cellulose-based resin. Among them, polyethylene terephthalate and the cycloolefin-based resin are suitably used.

The thickness of the transparent film 1 is not particularly limited, but is preferably 10 μm to 400 μm, more preferably 25 μm to 200 μm. When the thickness falls within the above-mentioned range, the transparent film 1 can have durability and appropriate flexibility, and therefore each transparent dielectric material layer and the transparent electrode layer can be formed thereon with good productivity by a roll-to-roll method.

The transparent film 1 may have a functional layer (not shown) such as a hard coat layer on one or both of the surfaces. For the film to have proper durability and flexibility, the thickness of the hard coat layer is preferably 2 to 10 μm, more preferably 3 to 9 μm, and further preferably 5 to 8 μm. The material of the hard coat layer is not particularly limited. Urethane-based resin, acrylic resin, silicone-based resin or the like being applied and cured can be appropriately used.

(Transparent Dielectric Material Layer)

The transparent dielectric material layer 2 containing oxide material as a main component is formed on the transparent film 1. The transparent dielectric material layer 2 can act as a gas barrier layer that suppresses volatilization of moisture and an organic substance from the transparent film 1 when the transparent electrode layer 4 is formed thereon, as well as a ground layer for film growth. In the present invention, the transparent electrode layer is formed on the transparent dielectric material layer, so that the transparent electrode layer can be made to have a reduced resistance. From the viewpoint of imparting these features to the transparent dielectric material layer and reducing creases when the transparent electrode layer is patterned, the thickness of the transparent dielectric material layer 2 is preferably 5 nm or more, more preferably 30 nm or more, further preferably 55 nm or more. On the other hand, from the viewpoint of transparency, the thickness of the dielectric material layer 2 is preferably 100 nm or less, more preferably 85 nm or less, and further preferably 70 nm or less.

The oxide which forms the transparent dielectric material layer 2 is preferably one that is colorless and transparent at least in a visible light region and has a resistivity of $1\times10^{-2}\Omega\cdot cm$ or more, and for example, an oxide of at least one element selected from the group consisting of Si, Nb, Ta, Ti, Zr and Hf is suitably used. Among them, silicon oxide and niobium oxide are preferred. In this specification, containing a substance "as a main component" means that the content of the substance is 51% by weight or more, preferably 70% by weight or more, and more preferably 90% by weight or more. Each layer may contain components other than the main component as long as the feature of the present invention is not impaired.

The transparent dielectric material layer 2 may include only one layer, or may include two or more layers. When the transparent dielectric material layer 2 includes two or more layers, by adjusting the thickness and refractive index of each layer, the transmittance and reflectivity of the substrate with a transparent electrode can be adjusted to improve the visibility of a display device.

Hereinafter, one having the transparent dielectric material layer 2 formed on the transparent film 1 may be referred to as a "transparent film substrate".

In a substrate with a transparent electrode for a capacitance touch panel, the transparent electrode layer 4 is patterned by etching or the like in a part of the plane. In this case, by adjusting the thickness and refractive index of the transparent dielectric material layer, a difference in transmittance, a difference in reflectivity and a color difference between the electrode layer-formed part 4a in which the electrode layer remains without being etched and the electrode layer-non-formed part 4b in which the electrode layer is removed by etching can be reduced to suppress the electrode pattern visibility.

In a preferred embodiment of the present invention, the transparent dielectric material layer 2 includes a first dielectric material layer 21, a second dielectric material layer 22 and a third dielectric material layer 23 in this order from the transparent film 1 side. For the purpose of enhancing adhesion between the transparent film and the dielectric material layer, the surface of the transparent film may be subjected to a surface treatment such as a corona discharge treatment or a plasma treatment prior to the formation of the first dielectric material layer.

When the transparent dielectric material layer includes three layers as described above, it is preferred that the refractive index $n_1$ of the first dielectric material layer, the refractive index $n_2$ of the second dielectric material layer and the refractive index $n_3$ of the third dielectric material layer satisfy the relationship of $n_3<n_1<n_2$. When the refractive indexes of the transparent dielectric material layers have this magnitude relationship, the reflectance at the interface between the transparent dielectric material layers is appropriately controlled, so that a substrate with a transparent electrode, which is excellent in visibility, is obtained. The refractive index of each of the transparent dielectric material layers and the transparent electrode layer is a refractive index for light having a wavelength of 550 nm, which is measured by spectroscopic ellipsometry. The thickness of each layer is determined by transmission electron microscope (TEM) observation of a cross section.

As the first dielectric material layer, a silicon oxide layer containing $SiO_x$ as a main component is preferably formed. The thickness $d_1$ of the first dielectric material layer 21 is preferably 1 nm to 25 nm. $d_1$ is preferably 2 nm or more, more preferably 3 nm or more, and further preferably 4 nm or more. $d_1$ is preferably 22 nm or less, more preferably 20 nm or less, and further preferably 15 nm or less. The refractive index $n_1$ of the first dielectric material layer is preferably 1.45 to 1.95, more preferably 1.47 to 1.85, and further preferably 1.49 to 1.75.

Including a silicon oxide layer as the first dielectric material layer 21 between the transparent film 1 and the second dielectric material layer 22 as a high-refractive index layer, a color difference ΔE between the electrode layer-formed part and the electrode layer-non-formed part is reduced, so that pattern visibility is suppressed. In the case where the high-refractive index layer is formed directly on the transparent film 1, creases along the pattern tend to be generated when the transparent electrode layer is patterned. On the other hand, when a silicon oxide layer is formed on the transparent film substrate 1, the generation of pattern creases is inhibited so that the pattern is hardly visible.

As the second dielectric material layer 22, a metal oxide layer is preferably formed. The thickness $d_2$ of the second dielectric material layer 22 is preferably 5 nm or more and less than 10 nm. $d_2$ is more preferably 6 nm to 9 nm. When the thickness $d_2$ of the second dielectric material layer 22 falls within the above-mentioned range, the reflectance difference and transmittance difference in a visible light short wavelength region between the electrode layer-formed part 4a and the electrode layer-non-formed part 4b can be reduced. The refractive index $n_2$ of the second dielectric material layer is preferably 2.00 to 2.35, more preferably 2.05 to 2.30, and further preferably 2.10 to 2.25. As a metal oxide having the above-mentioned refractive index, a metal oxide containing as a main component an oxide of a metal selected from the group consisting of Nb, Ta, Ti, Zr, Zn and Hf, or a composite oxide of these metals is preferred.

Preferably, the second dielectric material layer 22 has low absorption of visible light in a short wavelength region. From such a viewpoint, the material of the second dielectric material layer 22 is preferably niobium oxide ($Nb_2O_5$), tantalum oxide ($Ta_2O_5$), titanium oxide ($TiO_2$) or zirconium oxide ($ZrO_2$), and particularly niobium oxide is suitably used. The above-mentioned material has a high transmittance on the short wavelength side as compared to metal oxides such as indium oxide, tin oxide and cerium oxide, or composite metal oxides thereof, so that b* of transmitted light and reflected light of the substrate with a transparent electrode is easily adjusted to fall within a preferred range.

As the third dielectric material layer, a silicon oxide layer containing $SiO_y$ as a main component is preferably formed. Here, the silicon oxide $SiO_y$ used in the third dielectric material layer has an oxygen content higher than that of the silicon oxide $SiO_x$ used in the first dielectric material layer. In other words, y>x is satisfied. The silicon oxide generally has a refractive index that decreases as the oxygen content increases, and therefore by satisfying y>x, the refractive index $n_3$ of the third dielectric material layer can be made less than the refractive index $n_1$ of the first dielectric material layer. For the refractive index $n_1$ of the first dielectric material layer to fall within the above-mentioned preferred range, x is preferably 1.5 or more. That is, the composition ratios x and y of oxygen of $SiO_x$ as a main component of the first dielectric material layer and $SiO_y$ as a main component of the third dielectric material layer preferably satisfy 1.5≤x<y. Since the stoichiometric composition of the silicon oxide is $SiO_2$, the theoretical upper limit of y is 2.

The thickness $d_3$ of the third dielectric material layer 23 is preferably 35 nm to 80 nm. When the thickness of the third dielectric material layer is in the above-mentioned range, the transmittance of the substrate with a transparent electrode is enhanced, and the generation of pattern creases when the transparent electrode layer 4 is patterned is inhibited, so that a substrate with a transparent electrode is obtained in which the pattern is hardly visible. Particularly, from the viewpoint of inhibiting the generation of pattern creases, the thickness $d_3$ of the third dielectric material layer is more preferably 55 nm or more, and further preferably 57 nm or more.

When the thickness $d_3$ of the third dielectric material layer is large, the transmittance of the substrate with a transparent electrode is reduced, so that the pattern of the transparent electrode layer may be easily visible. Accordingly, the thickness $d_3$ of the third dielectric material layer is more preferably 75 nm or less, and further preferably 70 nm or less. On the other hand, as described later, by controlling the film characteristics of the transparent electrode layer 4, the generation of creases tends to be inhibited, and the transmittance of the electrode layer-formed part 4a tends to be enhanced. Particularly, when the thickness of the third dielectric material layer is large, the generation of creases tends to be more effectively inhibited. Accordingly, when the thickness $d_3$ of the third dielectric material layer 23 exceeds 55 nm, a substrate can be obtained with a transparent electrode in which pattern visibility of a transparent electrode layer is further suppressed.

The refractive index $n_3$ of the third dielectric material layer is preferably 1.43 or more, more preferably 1.45 or more, and further preferably 1.47 or more. When the third dielectric material layer has the above-mentioned refractive index, pattern creases tend to be reduced. Generally, among silicon oxides having the same composition ratio of oxygen, the refractive index increases as the film becomes denser. It is thought that in the present invention, the third dielectric material layer formed just below the transparent electrode layer is a dense film, so that stress at the interface is reduced, thus contributing to a reduction of pattern creases. On the other hand, from the viewpoint of controlling reflection characteristics at the interface to improve the transparency of the substrate with a transparent electrode, the refractive index $n_3$ of the third dielectric material layer is preferably 1.51 or less, more preferably 1.50 or less, and still more preferably 1.49 or less.

The thickness of each of the transparent dielectric material layers 21, 22 and 23 of the substrate 100 with a transparent electrode is adjusted to fall within the above-mentioned range, so that the generation of creases is inhibited along a pattern when the transparent electrode layer 4 is patterned. Accordingly, when a substrate with a transparent electrode having the above-mentioned configuration is used for a capacitance touch panel, the visibility of the display can be improved.

In the substrate with a transparent electrode, not only the thickness but also the refractive index of each of the transparent dielectric material layers 21, 22 and 23 is adjusted to fall within the above-mentioned range, and thus multiple interference of light at the interface is properly controlled. Accordingly, even when the transparent electrode layer is patterned, the color difference of transmitted light and reflected light between the electrode layer-formed part 4a and the electrode layer-non-formed part 4b is reduced, so that the pattern visibility of the transparent electrode layer is suppressed.

For more effectively suppressing the pattern visibility of the transparent electrode layer by reducing a difference in reflectivity and a difference in transmittance between the electrode layer-formed part 4a and the electrode layer-non-formed part 4b, the optical thickness $n_1d_1$ represented by a product of the refractive index $n_1$ and the thickness $d_1$ of the first dielectric material layer is preferably 2 nm to 40 nm. $n_1d_1$ is more preferably 4 nm or more, and further preferably 6 nm or more. $n_1d_1$ is more preferably 36 nm or less, and further preferably 32 nm or less. Similarly, an optical thickness $n_2d_2$ of the second dielectric material layer is preferably 11 nm to 20 nm. $n_2d_2$ is more preferably 12 nm or more, and further preferably 13 nm or more. $n_2d_2$ is more preferably 19 nm or less, and further preferably 18 nm or less. An optical thickness $n_3d_3$ of the third dielectric material layer is preferably 50 nm to 110 nm. $n_3d_3$ is more preferably 55 nm or more, and further preferably 60 nm or more. $n_3d_3$ is more preferably 100 nm or less, further preferably 90 nm or less, and especially preferably 80 nm or less.

The arithmetic mean roughness Ra on a transparent electrode layer 4 formation side surface of the transparent film substrate 10 is preferably 1 nm or less, more preferably 0.8 nm or less, and further preferably 0.6 nm or less. When the transparent dielectric material layer 2 is formed on the transparent film 1, and the arithmetic mean roughness of the transparent dielectric material layer 2 is preferably within the above-mentioned range. In a case where three-layers of dielectric material layers 21, 22, 23 are formed as shown in FIG. 1, the arithmetic mean roughness of the third dielectric material layer 23, which is formed directly under the transparent electrode layer, is preferably within the above-mentioned range. The arithmetic mean roughness Ra is calculated in accordance with JIS B0601: 2001 (ISO 1302: 2002)

on the basis of a surface shape (roughness curve) measured by a non-contact method using a scanning probe microscope.

When the surface of the transparent film substrate 10 is made smooth, crystallization of the transparent electrode layer 4 that is formed thereon tends to be promoted to easily obtain a transparent electrode layer having a low resistivity. In the case where the transparent electrode layer 4 is formed on a layer including three layers: transparent dielectric material layers 21, 22 and 23 as shown in FIG. 1, pattern creases when the transparent electrode layer is patterned tend to be reduced by making smooth the surface of the third dielectric material layer 23 that is formed just below the transparent electrode layer.

(Transparent Electrode Layer)

As the transparent electrode layer 4, a conductive oxide layer containing indium-tin composite oxide (ITO) as a main component is formed. The thickness $d_4$ of the transparent electrode layer 4 is preferably 15 to 110 nm. When the substrate 100 with a transparent electrode is used for a capacitance touch panel, the thickness $d_4$ of the transparent electrode layer 4 is preferably 15 nm to 40 nm, more preferably 21 nm to 35 nm, and further preferably 23 nm to 30 nm. When the thickness of the transparent electrode layer is in the above-mentioned range, a transparent electrode layer having a low resistance and a high transmittance is obtained. For effectively suppressing the pattern visibility of the transparent electrode layer, the thickness $d_4$ is further preferably 32 nm or less, and especially preferably 26 nm or less.

The refractive index $n_4$ of the transparent electrode layer is preferably 1.88 or less. When the refractive index of the transparent electrode layer is decreased, the transparent electrode layer tends to have a reduced resistance. When a low-refractive index transparent electrode layer is formed on the transparent dielectric material layer 2, the generation of pattern creases tends to be inhibited after the transparent electrode layer is patterned by etching or the like. $n_4$ is preferably 1.86 or less, and more preferably 1.84 or less. The lower limit of $n_4$ is not particularly limited. As described in Patent Documents 1 to 4, the refractive index of the ITO thin film formed on the film is generally 1.90 or more, but in the present invention, ITO having a lower refractive index as compared to these prior techniques is formed, so that the transparent electrode layer has a reduced resistance and the generation of creases is inhibited when the transparent electrode layer is patterned.

Preferably, the refractive index $n_4$ of the transparent electrode layer 4 is smaller than the refractive index $n_2$ of the second dielectric material layer and larger than the refractive index $n_1$ of the first dielectric material layer from the viewpoint of suppressing pattern visibility. In other words, preferably, the refractive indexes of the layers of the substrate with a transparent electrode according to the present invention satisfy the relationship of $n_3<n_1<n_4<n_2$. As described in detail later, the refractive index $n_4$ of the transparent electrode layer can be made to fall within the above-mentioned range by adjusting the content of tin oxide in ITO, deposition conditions and surface roughness of the transparent dielectric material layer as a ground layer of the transparent electrode layer, and so on.

The resistivity of the transparent electrode layer 4 is preferably $5.0\times10^{-4}\,\Omega\cdot cm$ or less, more preferably $4.5\times10^{-4}\,\Omega\cdot cm$ or less, and further preferably $3.7\times10^{-4}\,\Omega\cdot cm$ or less. When the resistivity of the transparent electrode layer falls within the above-mentioned range, the response speed can be enhanced when the substrate with a transparent electrode is used for a capacitance touch panel. The sheet resistance of the transparent electrode layer is preferably $250\,\Omega/sq$ or less, more preferably $200\,\Omega/sq$ or less, further preferably $160\,\Omega/sq$ or less, especially preferably $145\,\Omega/sq$ or less, and most preferably $130\,\Omega/sq$ or less. When the transparent electrode layer has a low resistance, the substrate with a transparent electrode can contribute to improvement of the response speed of the capacitance touch panel. When used for organic EL illumination, the substrate with a transparent electrode can contribute to the uniformity of luminance in the plane when the transparent electrode layer has a low resistance.

Further, in the present invention, generation of creases along the pattern of the transparent electrode layer 4 tends to be inhibited when the transparent electrode layer 4 having a low resistivity is formed on the transparent dielectric material layer 2. From such a viewpoint, the resistivity of the transparent electrode layer 4 is preferably $3.7\times10^{-4}\,\Omega\cdot cm$ or less. The reason why the generation of creases is inhibited when the resistivity of the transparent electrode layer 4 is low is not clear, but it is thought that one of the causes is that the crystal properties of ITO affect conductivity, and also affect stress at an interface between the transparent electrode layer 4 and the transparent dielectric material layer 2.

For the resistivity to fall within the above-mentioned range, the content of tin oxide in the transparent electrode layer is preferably 4 parts by weight to 14 parts by weight based on 100 parts by weight of the sum of indium oxide and tin oxide. For the transparent electrode layer to have a low resistance, the content of tin oxide is more preferably 5 parts by weight to 10 parts by weight. When the content of tin oxide is increased, the density of carriers in the transparent electrode layer tends to be increased, leading to a reduction in resistance. On the other hand, when the content of tin oxide is 14 parts by weight or less, the crystallization of ITO easily proceeds, so that the resistivity is easily decreased, and a reduction in transmittance tends to be suppressed. When the content of tin oxide is 8 parts by weight or less, amorphous ITO film can be crystallized without heating at a high temperature for a long time, so that the productivity of the substrate with a transparent electrode can be improved.

For the transparent electrode 4 to have a low resistance, the density of carriers in the transparent electrode layer 4 is preferably $5.0\times10^{20}/cm^3$ or more, more preferably $5.5\times10^{20}/cm^3$ or more, and further preferably $6.1\times10^{20}/cm^3$ or more. The hole mobility is preferably $25\ cm^3/V\cdot S$ or more, and more preferably $30\ cm^3/V\cdot S$ or more.

The average crystal grain size of the transparent electrode layer 4 is preferably 110 nm to 700 nm, more preferably 150 nm to 550 nm, and further preferably 200 nm to 400 nm. When the crystal grain size is in the above-mentioned range, the transparent electrode layer tends to have a low resistance and a high transmittance. When the crystal grain size is large, the resistivity may be reduced because crystal grain boundaries decrease to enhance the generation efficiency and mobility of carriers. On the other hand, when the crystal grain size is 700 nm or less, it is easy to obtain a transparent electrode layer which has proper flexibility and in which the generation of cracks is inhibited.

The variation coefficient of the crystal grain size of the transparent electrode layer 4 is preferably 0.35 or more, more preferably 0.40 or more, and further preferably 0.45 or more. Generally, in a substrate with an electrode, which includes an ITO transparent electrode layer, it is difficult to obtain a film having a low resistance as described above unless the ITO is high-Sn-containing ITO having a tin oxide content of, for example, 10% or more. When the content of tin oxide is increased, heating at a high temperature for a long time is required for crystallization, and therefore it is difficult to reduce the resistivity in a substrate with a transparent electrode, which uses a film substrate. In the present invention, the average crystal grain size of crystals is increased, and also the variation coefficient is made to fall within a specific range, so that the resistance can be reduced even when the tin oxide content of the transparent electrode layer is low.

The average crystal grain size and the variation coefficient of the crystal grain size in the transparent electrode layer are determined by observing the surface of the transparent electrode layer 4 under a microscope. An area S of each crystal grain having a polygonal region is determined, and a diameter $D=2\times(S/\pi)^{1/2}$ of the crystal grain assumed to have a circular shape is defined as a crystal grain size. Crystal grain sizes D of all crystal grains in the observed region are determined, and an average value $D_{ave}$ (=average grain size) of crystal grain sizes is calculated. A standard deviation a of the crystal grain size is calculated and divided by the average grain size $D_{ave}$ to obtain a variation coefficient ($=\delta/D_{ave}$). In this description, the layer is "crystalline" when the ratio of an area constituted by crystal grains during microscope observation (crystallization rate) is 70% or more, and the layer is "amorphous" when the crystallization rate is less than 70%. The crystallization rate of the transparent electrode layer 4 is preferably 80% or more, and more preferably 90% or more.

In the case where the transparent dielectric material layer 2 has the first dielectric material layer 21, the second dielectric material layer 22 and the third dielectric material layer 23 in this order from the transparent film 1 side, and where the transparent electrode layer has the above-mentioned crystal properties, the transparent electrode layer has a reduced resistivity, and the generation of creases along the pattern of the transparent electrode layer tends to be inhibited. Moreover, since the transmittance of the transparent electrode layer is improved, the pattern of the transparent electrode layer tends to be hardly visible. Accordingly, even when the thickness $d_3$ of the third dielectric material layer 23 is large, or the thickness $d_3$ is small, a substrate with a transparent electrode, which is excellent in visibility (transparency), is obtained.

That is, when the transparent electrode layer 4 has the above-mentioned resistivity and crystal properties in the case where the transparent dielectric material layer has three layers: transparent dielectric material layers 21, 22 and 23 as shown in FIG. 1, the substrate 100 with a transparent electrode, which is excellent in visibility, tends to be obtained over a wider range of the thickness $d_3$ of the third dielectric material layer 23. Particularly, when the thickness $d_3$ of the third dielectric material layer is larger than 55 nm, the generation of creases tends to be effectively inhibited to considerably improve visibility as the transparent electrode layer has the above-mentioned resistivity and crystal properties.

The substrate with a transparent electrode according to the present invention may have other layers between the transparent film 1 and the transparent dielectric material layer 2 and on the transparent electrode layer 4 or on the surface of the transparent film 1 at the transparent electrode non-formed surface side, as long as the feature of the present invention is not impaired. The substrate with a transparent electrode according to the present invention may have transparent electrode layers on both surfaces of the transparent film 1.

[Method for Manufacturing Substrate with Transparent Electrode]

The substrate 100 with a transparent electrode is obtained by forming the transparent dielectric material layer 2 and the transparent electrode layer 4 on the transparent film 1.

The method for forming the transparent dielectric material layer 2 is not particularly limited as long as a uniform thin film is formed. Examples of the deposition method include: PVD methods such as a sputtering method and a vapor deposition method, dry coating methods such as various kinds of CVD methods; and wet coating methods such as a spin coating method, a roll coating method, a spray coating method and a dipping coating method. Among the deposition methods described above, dry coating methods are preferred because a thin film at a nanometer level is easily formed. Particularly, the sputtering method is preferred in that the thickness of each layer is controlled in an order of several nanometers to suppress the pattern visibility of the transparent electrode layer.

When each transparent dielectric material layer is formed by the sputtering method, a metal, a metal oxide, a metal carbide or the like can be used as a target. As a power source, DC, RF or MF power source or the like can be used. MF power source is preferred from the viewpoint of productivity. The applied power during deposition is not particularly limited, but is preferably adjusted to the extent that excessive heat is not given to the transparent film substrate, and productivity is not impaired. In the case where an $SiO_x$ as the first dielectric material layer 21, a metal oxide layer as the second dielectric material layer 22, and an $SiO_y$ as the third dielectric material layer 23 are formed, for example, the power density during deposition of the first dielectric material layer is preferably 0.5 to 10 W/cm$^2$, the power density during deposition of the second dielectric material layer is preferably 0.5 to 8 W/cm$^2$, and the power density during deposition of the third dielectric material layer is preferably 0.2 to 10 W/cm$^2$.

Before the formation of each dielectric material layer is started, pre-sputtering may be performed for the purpose of removing oxide films, moisture and the like accumulated on the surface of a target. When pre-sputtering is performed, deposition of contaminated target particles on the substrate is suppressed. Particularly, in the present invention, it is preferred to perform pre-sputtering before the formation of a silicon oxide layer that is the third dielectric material layer. Particularly, when pre-sputtering is performed before the third dielectric material layer is formed, film quality is improved, and the generation of creases tends to be inhibited when the transparent electrode layer 4 is patterned. For inhibiting the generation of creases, it is preferred that pre-sputtering before formation of the third dielectric material layer be performed under conditions in which the flow rate of an inert gas is higher or the pressure is higher as compared to conditions for the formation of the third dielectric material layer.

The substrate can also be subjected to a bombardment step before the formation of each dielectric material layer is started. In the bombardment step, SUS target or the like is used and plasma is generated by performing discharge under a supply of a gas containing an inert gas such as argon as a main component. When the substrate is subjected to the bombardment step, the substrate is exposed to plasma to remove oxide films, organic components and the like on the surface of the substrate, so that the film quality of a dielectric material layer formed on the substrate and a transparent electrode layer formed on the dielectric material layer can be improved.

The deposition pressure for forming each transparent dielectric material layer can be appropriately set. When three layers: transparent dielectric material layers 21, 22 and 23 are formed as shown in FIG. 1, it is preferred that the third dielectric material layer 23 to be formed just below the transparent electrode layer be formed under a pressure of less than 0.4 by the sputtering method. The deposition pressure for forming the third dielectric material layer is more preferably 0.35 Pa or less, and further preferably 0.25 Pa or less. By decreasing the deposition pressure for forming the third dielectric material layer, the surface of the transparent electrode layer formation side can be made smooth to decrease the arithmetic mean roughness Ra. When the third dielectric material layer is formed at a low pressure of less than 0.4 Pa, the transparent electrode layer that is formed thereon tends to have a reduced refractive index and a reduced resistance.

When the third dielectric material layer is formed under a low-pressure condition, generation of pattern creases tends to be inhibited when the transparent electrode layer that is formed thereon is patterned by etching or the like. The reason why pattern creases of the transparent electrode layer are inhibited by adjusting deposition conditions for the formation of the third dielectric material layer is not clear, but it is considered as one of the causes that the crystallinity, surface shape, surface property and the like of the third dielectric material layer as a ground layer affect film growth of the transparent electrode layer. For example, it is thought that the physical properties of the third dielectric material layer affect the crystallinity, internal residual stress and the like of an ITO film which forms the transparent electrode layer, so that the imbalance of interface stress between the electrode layer-formed part and the electrode layer-non-formed part is eliminated, thus contributing to the inhibition of pattern creases.

In the case where three-layers of dielectric material layers 21, 22, 23 are formed as shown in FIG. 1, the first dielectric material layer 21 is also preferably formed under a pressure of less than 0.4 by the sputtering method. The deposition pressure for forming the first dielectric material layer is more preferably 0.35 Pa or less, and further preferably 0.25 Pa or less. By decreasing the deposition pressure for forming the first dielectric material layer, as well as decreasing the deposition pressure for forming the third dielectric material layer, the generation of pattern creases tends to be inhibited. The reason why pattern creases of the transparent electrode layer are inhibited by adjusting the deposition conditions for the formation of the first dielectric material layer is not clear, but it is considered to be one of the causes that crystallinity, surface shape, surface property and the like of the first dielectric material layer affect the film growth of the third dielectric material layer and the transparent electrode layer via the second dielectric material layer.

The method for forming the transparent electrode layer 4 is preferably a method in which an amorphous transparent electrode layer containing amorphous ITO as a main component is formed on the transparent film substrate 10, and ITO is then crystallized by heating. The method for forming the amorphous transparent electrode layer on the transparent film substrate 10 is preferably a sputtering method. As a sputtering power source, a DC, RF or MF power source or the like can be used. Particularly, in the present invention, a MF power source is suitably used from the viewpoint of productivity and reduction of resistance.

When the transparent electrode layer 4 is formed by the sputtering method, a metal, a metal oxide or the like is used as a target. As an introduced gas that is used for deposition, a gas containing an inert gas such as argon as a main component is preferred. Here, "containing an inert gas as a main component" means that an inert gas such as argon is contained in an amount of 50% or more among gases that are used. The introduced gas may be an inert gas such as argon alone, or a mixed gas of two or more gases. Particularly, a mixed gas of argon and oxygen is preferred. The mixed gas of argon and oxygen contains oxygen preferably in an amount of 0.2 to 5% by volume, and more preferably in an amount of 1.0 to 4% by volume. By supplying the above-mentioned volume of oxygen, the transparency and electrical conductivity of the transparent electrode layer can be improved. The mixed gas of argon and oxygen may contain other gases as long as the feature of the present invention is not impaired. Before the transparent electrode layer is formed, pre-sputtering of the target and bombardment of the substrate may be performed.

For obtaining the transparent electrode layer 4 having a low resistance and a high transparency, the magnetic flux density of the surface of the target during sputtering deposition is preferably 30 mT or more, more preferably 35 mT or more, and further preferably 40 mT or more. Generally, the deposition of ITO is performed at a low magnetic field of about 10 to 20 mT for enhancing the utilization efficiency of the target by properly producing discharge. On the other hand, by enhancing the magnetic flux density during the deposition of the transparent electrode layer, the average value and the variation coefficient of the crystal grain size of the transparent electrode layer can be increased, so that an ITO transparent electrode layer having a low resistance is easily obtained.

The reason why the average value and the variation coefficient of the crystal grain size is increased by enhancing the magnetic flux density during deposition is not clear, but it is considered that crystal nuclei that are the center of crystal growth are easily randomly generated spatially and temporally. It is thought that the generation and growth of these crystal nuclei are related to a situation in which energy of sputtering particles arriving at the film substrate is low because the power source voltage decreases due to the enhancement of the magnetic flux density. For example, it is considered that, since the energy of the sputtering particles is low, the migration and diffusion of sputtering particles on the substrate are suppressed, so that crystal nuclei are randomly generated, leading to an increase in the average grain size and variation coefficient of the crystal grains. It is also considered that the surface state of the substrate may affect the ease of diffusion of the sputtering particles because the average grain size and the variation coefficient of the crystal grains are increased by enhancement of the magnetic flux density only when a film is formed on the transparent dielectric material layer of the surface of the substrate.

By enhancing the magnetic flux density of the surface of the target during sputtering deposition, the transparency (transmittance) of the transparent electrode layer can be improved. When the transparency of the transparent electrode layer is improved, a difference in transmittance, a difference in reflectivity, a color difference and the like can be reduced between the electrode layer-formed part and the electrode layer-non-formed part when the transparent electrode layer is patterned, so that a substrate with a transparent electrode in which the pattern is hardly visible can be obtained.

Further, when the transparent electrode layer 4 is formed on a dielectric material layer including three layers: the first dielectric material layer 21, the second dielectric material layer 22 and the third dielectric material layer 23 as shown in FIG. 1, pattern creases when the transparent electrode layer is patterned tend to be inhibited by enhancing the magnetic flux density of the surface of the target during sputtering deposition.

The upper limit of the magnetic flux density is not particularly limited, but the effect of inhibiting pattern visibility and reducing the resistivity in the transparent electrode layer tends to be saturated when the magnetic flux density is excessively enhanced. On the other hand, the efficiency of sputtering deposition tends to be reduced as the magnetic flux density increases. Accordingly, from the viewpoint of deposition efficiency, the magnetic flux density of the surface of the target during sputtering deposition is preferably less than 100 mT, more preferably less than 90 mT, and further preferably less than 80 mT.

The power source voltage during sputtering deposition is preferably 100 V to 500 V, more preferably 150 V to 450 V, further preferably 200 V to 400 V when a MF power source is used. When a DC power source is used, the power source voltage is preferably 50 V to 250 V, more preferably 75 V to 225 V, and further preferably 100 V to 200 V.

The substrate temperature when the transparent electrode layer is formed by the sputtering method should be in a range of temperatures at which the transparent film 1 has heat resistance. For example, the substrate temperature is preferably −35° C. to 35° C., more preferably −30° C. to 30° C., and further preferably −25° C. to 25° C. When the substrate temperature is 35° C. or lower, for example, volatilization of moisture and organic substances (e.g. oligomer components) from the transparent film is suppressed, so that ITO is easily crystallized, and the resistance can be reduced. When the substrate temperature is −35° C. or higher, a reduction in transmittance of the transparent electrode layer and embrittlement of the transparent film substrate can be suppressed.

It is preferable to perform a heat treatment after the deposition in order to obtain an ITO film having a low refractive index and a low resistance as the transparent electrode layer. The heat treatment causes crystallization of ITO to proceed, so that the transparent electrode layer tends to have a reduced refractive index and a reduced resistivity, and the transmittance tends to be increased. The heat treatment of the transparent electrode layer is performed, for example, in an oven at 120° C. to 150° C. for 30 to 60 minutes. Alternatively, the heat treatment is performed at a relatively lower temperature for a long time, such as lower temperature (for example, about 50° C. to 120° C.) for 1 day to 3 days.

The heat treatment of the transparent electrode layer may be performed before or after patterning of the transparent electrode layer. The heat treatment of the transparent electrode layer may also serve as a heat annealing treatment for the formation of a touch panel, such as a heat treatment during the formation of a route wiring. When the heat treatment of the transparent electroconductive layer is performed, the refractive index $n_4$ of the transparent electroconductive layer after the heat treatment preferably falls within the above-mentioned range. In this case, the refractive index of the transparent electroconductive layer before the heat treatment may be more than 1.88.

In the case where the substrate with a transparent electrode according to the present invention is patterned into an electrode layer-formed part 4a and an electrode layer-non-formed part 4b, the patterning is performed by, for example, after the formation of the transparent electrode layer, removing the transparent electrode layer by etching or the like in a part of the plane.

The method for etching the transparent electrode layer may be one of a wet process and a dry process. The wet process is suitable in that only the transparent electrode layer 4 is easily and selectively removed. In the present invention, the thickness of each transparent dielectric material layer is adjusted so that the color differences of transmitted light and the color difference of reflected light are decreased, and therefore it is preferred that, when the transparent electrode layer 4 is patterned, the transparent dielectric material layers are not removed, but only the transparent electrode layer 4 is selectively removed.

As the wet process, a photolithography method is preferred. A photoresist, a developer and a rinsing agent for use in photolithography can be arbitrarily selected as long as a specific pattern can be formed without affecting the transparent electrode layer 4. As an etchant, a liquid, which allows removal of the transparent electrode layer 4 and does not affect a silicon oxide of the third dielectric material layer, is suitably used.

In the substrate with a transparent electrode according to the present invention, the generation of pattern creases is inhibited and the color difference of transmitted light and the color difference of reflected light between the electrode layer-formed part and the electrode layer-non-formed part are small, so that pattern visibility is suppressed. The color difference of transmitted light between the electrode layer-formed part and the electrode layer-non-formed part is preferably 0.8 or less, more preferably 0.4 or less, further preferably 0.3 or less, and especially preferably 0.2 or less. The color difference of reflected light between the electrode layer-formed part and the electrode layer-non-formed part is preferably 2.4 or less, more preferably 1.9 or less, further preferably 1.6 or less, and especially preferably 1.4 or less.

In the substrate with a transparent electrode according to the present invention, b* of transmitted light of the electrode layer-formed part is preferably −2 to 1, which indicates that the light is blue to colorless, and more preferably −1 to 0.5, in that the chromaticity of a screen during formation of a touch panel is improved.

Here, the chromaticity is a value defined by JIS Z8730, and can be represented by a CIE lightness L* and color coordinates a* and b*. The a* axis represents green to red, where negative values correspond to green and positive values correspond to red. The b* axis represents blue to yellow, where negative values correspond to blue and positive values correspond to yellow. A difference in chromaticity between two rays of light can be evaluated by a color difference ΔE represented by the following formula.

$$\Delta E = \{(\Delta L^*)^2 + (\Delta a^*)^2 + (\Delta b^*)^2\}^{1/2}$$

In the substrate with a transparent electrode according to the present invention, the transmittance of the substrate at the electrode layer-formed part is preferably 87% or more, and more preferably 88% or more. When the transmittance of the substrate with a transparent electrode is in the above-mentioned range, the visibility of a screen when the substrate with a transparent electrode is mounted on a touch panel can be improved. Here, in this description, the "transmittance" is a total light transmittance measured in accordance with JIS K7361, and can be measured using a haze meter.

The substrate with a transparent electrode according to the present invention is suitably used as a transparent electrode for a touch panel. Particularly, the substrate with a transparent electrode according to the present invention is suitably used for a capacitance touch panel because the pattern is hardly visible, and the transparent electrode layer has a low resistance.

In formation of a touch panel, an electroconductive ink or paste is applied onto the substrate with a transparent electrode, and a heat treatment is performed to form a collecting electrode as wiring for a routing circuit. The heat treatment method is not particularly limited, and examples thereof include a method of heating using an oven, an IR heater or the like. The temperature/time for the heat treatment is appropriately set in consideration of a temperature/time that allows the electroconductive paste to be attached to the transparent electrode. Examples include a heat treatment at 120 to 150° C. for 30 to 60 minutes for heating by the oven, and a heat treatment at 150° C. for 5 minutes for heating by the IR heater. The method for formation of a wiring for routing circuit is not limited to the above-mentioned method, and the wiring may be formed by a dry coating method. When the wiring for a routing circuit is formed by photolithography, the wiring can be made thinner.

EXAMPLES

The present invention will be described more specifically below by showing Examples and Comparative Examples, but the present invention is not limited to these examples.

[Evaluation Methods]

For determining the refractive index of each of the transparent dielectric material layers and a transparent electrode layer, a refractive index value for light having a wavelength of 550 nm was determined by spectroscopic ellipsometry measurement and by performing fitting using a cauchy model and a tauc-lorentz model. In the measurement, a sample prepared by polishing the surface on the transparent electroconductive layer non-formed surface side was used in order to eliminate influences of light interference by a hard coat layer. In the fitting, a value determined by transmission electron microscope (TEM) observation of a cross section of a substrate with a transparent electrode was used for the thickness of each of the transparent dielectric material layers and the transparent electrode layer. An accuracy of the fitting was checked by confirming that a transmittance and a reflectivity calculated by a simulation using measured values of the refractive index, extinction coefficient and thickness of each of the transparent dielectric material layers and the transparent electroconductive layer were consistent with measured values by a spectrophotometer.

The surface resistance of the transparent electrode layer was measured by four-point probe measurement using a low resistivity meter Loresta GP (MCP-T710, manufactured by Mitsubishi Chemical Corporation). The resistivity of the transparent electroconductive layer was calculated from a product of the value of the above-mentioned surface resistance and the thickness. A transmittance (total light transmittance) of the electrode layer-formed part of the substrate with a transparent electrode was measured in accordance with JIS K7361 using a haze meter (NDH 5000, manufactured by NIPPON DENSHOKU INDUSTRIES Co., LTD). b* was measured in accordance with JIS Z8730 using a spectrophotometer (CM-3600d, manufactured by KONICA MINOLTA, INC).

Presence/absence of pattern creases for the substrate with a transparent electrode was determined by visual inspection. Reflected light from a fluorescent lamp was observed while the substrate with a transparent electrode was arranged so that the pattern formation direction of the transparent electrode layer and reflected light from a straight fluorescent lamp were substantially orthogonal to each other. Samples were rated by five phases of evaluation such that a sample, for which a reflected image of the fluorescent lamp seemed like a straight line, was rated as score 5 (creases absent), and a sample, for which the reflected image seemed considerably distorted, was rated as score 1 (creases present).

Pattern visibility of transmitted light in the substrate with a transparent electrode was visually evaluated by observing the substrate with a transparent electrode on a light box in a dark room. Pattern visibility of reflected light in the substrate with a transparent electrode was visually evaluated by observing reflected light from the substrate with a transparent electrode under a fluorescent lamp. For each transmitted light and reflected light, samples were rated by five phases of evaluation such that a sample, for which the existence of a pattern (coloring of electrode layer-formed part) could not be observed, was rated as score 5 (no coloring), and a sample, for which the existence of a pattern was clearly observed, was rated as score 1.

The surface shape of the surface of the transparent dielectric material layer was measured with a scanning probe microscope (Nano-R, manufactured by Pacific Nanotechnology, Inc.) using a sample cut to a 5 mm square. The arithmetic mean roughness Ra was calculated in accordance with JIS B0601: 2001 (ISO 1302: 2002) on the basis of a surface shape (roughness curve) measured in a range of 0.7 m in a non-contact mode.

The carrier density was measured by the van der Pauw method. This sample was snapped into a 1 cm square, and metal indium was fused at the four corners thereof as an electrode. The Hall mobility was measured based on a potential difference at the time of passing a current of 1 mA in the diagonal direction of a substrate at a magnetic force of 3500 gauss, and the carrier density was calculated.

Figure 2:
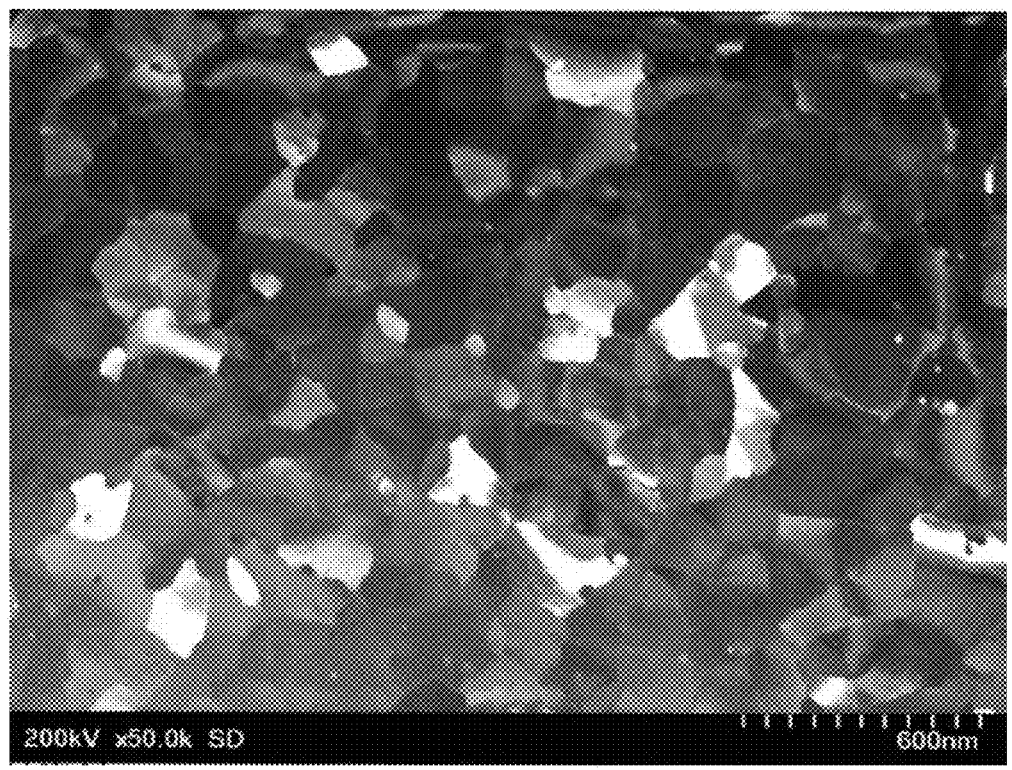
FIG. 2 is a microscope observation photograph of the transparent electrode layers in Reference Example 2 (magnetic flux density during deposition is 16 mT).
Figure 3:
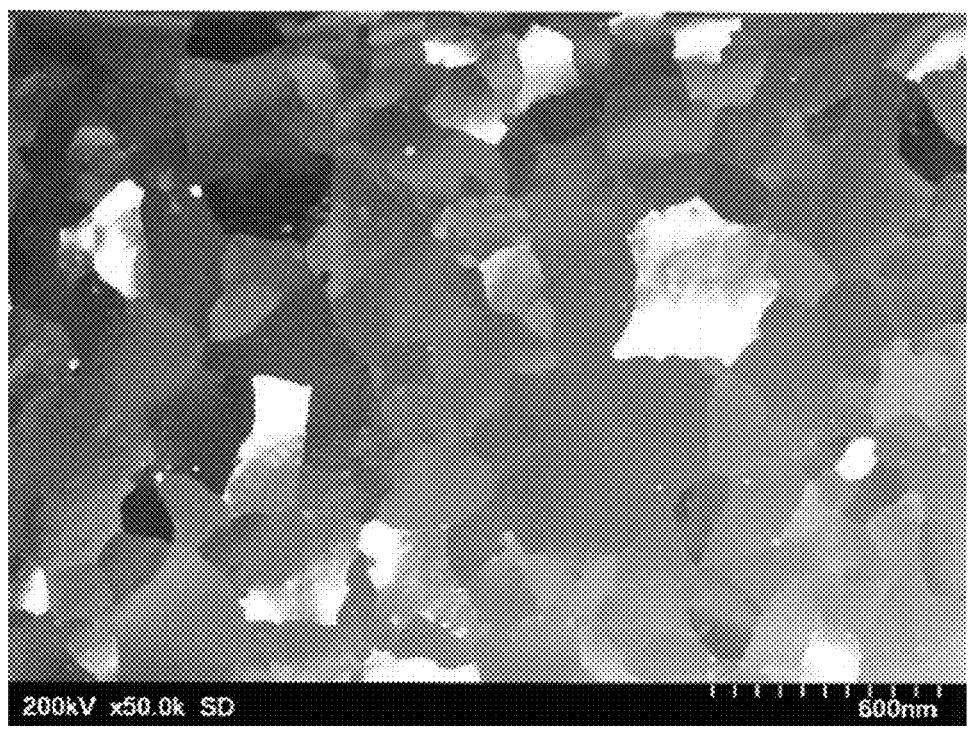
FIG. 3 is a microscope observation photograph of the transparent electrode layers in Reference Example 3 (magnetic flux density during deposition is 46 mT).

An average grain size and a variation coefficient of crystal grain sizes of crystals in the transparent electrode layer were calculated based on a plane observation photograph of the transparent electrode layer with a scanning transmission electron microscope (STEM) (see FIGS. 2 and 3). An observation sample was prepared by argon ion milling at an accelerated voltage of 2.0 kV using an ion milling device (PIPS TH manufactured by TOPCON TECHNOHOUSE CORPORATION), and plane observation was performed at an accelerated voltage of 200 kV and a magnification of 50,000 using a STEM (HD-2700 manufactured by Hitachi, Ltd.).

Example 1

On one of the surfaces of a biaxially oriented PET film having a thickness of 188 μm, which was provided on both surfaces with hard coat layers (refractive index: 1.53) formed of a urethane-based resin, a middle-refractive-index transparent dielectric material layer (first dielectric material layer) consisting of silicon oxide ($SiO_x$ layer), a high-refractive-index transparent dielectric material layer (second dielectric material layer) consisting of niobium oxide and a low-refractive-index dielectric material layer (third dielectric material layer) consisting of silicon oxide ($SiO_2$) were sequentially formed using a roll-to-roll sputtering device.

First, using B—Si as a target, sputtering was performed under conditions of a device internal pressure of 0.2 Pa, a substrate temperature of −20° C. and a power density of 1.4 W/cm$^2$ while an oxygen/argon (20 sccm/400 sccm) mixed gas was introduced into the device. The obtained $SiO_y$ layer had a thickness of 5 nm and a refractive index of 1.65.

On this SiO$_x$ layer, the high-refractive-index transparent dielectric material layer was formed. Using niobium (Nb) as a target, sputtering was performed under conditions of a device internal pressure of 0.87 Pa, a substrate temperature of −20° C. and a power density of 8.1 W/cm$^2$ while an oxygen/argon (160 sccm/1600 sccm) mixed gas was introduced into the device. The obtained niobium oxide (Nb$_2$O$_5$) layer had a thickness of 7 nm and a refractive index of 2.18.

On this niobium oxide layer, the low-refractive-index transparent dielectric material layer was formed. Using B—Si as a target, sputtering was performed under conditions of a device internal pressure of 0.2 Pa, a substrate temperature of −20° C. and a power density of 10.2 W/cm$^2$ while an oxygen/argon (190 sccm/400 sccm) mixed gas was introduced into the device. The obtained SiO$_x$ layer (x=2) had a thickness of 50 nm, a refractive index of 1.47 and a surface arithmetic mean roughness Ra of 0.5 nm.

On the transparent dielectric material layer of the transparent film substrate, an amorphous ITO transparent electrode layer was formed using a roll-to-roll sputtering device having an MF power source. Using an indium-tin composite oxide (content of tin oxide: 5% by weight) as a target, sputtering deposition was performed under conditions of a device internal pressure of 0.4 Pa, a substrate temperature of −20° C. and a power density of 5.2 W/cm$^2$ while an oxygen/argon (2 sccm/1000 sccm) mixed gas was introduced into the device. The obtained transparent electrode layer had a thickness of 25 nm. A magnetic flux density of the surface of the target was 46 mT as measured by bringing a magnetic flux density meter into contact with the surface of the target. The voltage of the MF power source during sputtering deposition was 357 V.

Thereafter, the transparent electrode layer was patterned by photolithography. First, a photoresist (trade name: TSMR-8900 (manufactured by TOKYO OHKA KOGYO Co., Ltd.)) was applied onto the transparent electrode layer with a thickness of about 2 m by spin coating, and then pre-baked in an oven at 90° C. Ultraviolet light of 40 mJ was applied via a photomask. Thereafter, the photoresist layer was post-baked at 110° C., and patterning was performed using a developer (trade name: NMD-W (manufactured by TOKYO OHKA KOGYO Co., Ltd.)). Further, the transparent electrode layer was etched using an etchant (trade name: ITO 02 (manufactured by Kanto Chemical Co., Inc.)). Finally, a remaining photoresist was removed using a rinsing liquid (trade name: 104 (manufactured by TOKYO OHKA KOGYO Co., Ltd.)).

Thereafter, a heat-treatment was performed for 60 minutes in an oven at 150° C. The refractive index of the ITO layer after the heat-treatment was 1.85. The transmittance in the electrode layer-formed part was 88.6%.

Examples 2 to 9 and Comparative Examples 1 to 3

The thickness d$_2$ of the second dielectric material layer, the thickness d$_3$ of the third dielectric material layer and the thickness of the transparent electrode layer were changed as shown in Table 1. In the same manner as in Example 1, except for the change, a first dielectric material layer, a second dielectric material layer, a third dielectric material layer and a transparent electrode layer were sequentially formed, and the transparent electrode layer was then patterned and a heat-treatment was performed.

The transmittance of the electrode layer-formed part of the substrate with a transparent electrode in Comparative Example 2 was 88.2%. The transmittances of the electrode layer-formed parts of the substrates with a transparent electrode in Example 2, Example 4, Example 5 and Example 8 were 89.1%, 89.4%, 88.4% and 88.8%, respectively.

Example 10

By changing a permanent magnet to be attached to the sputtering device, the magnetic flux density in the deposition of the transparent electrode layer was adjusted to 16 mT. The voltage of the MF power source during sputtering deposition was 511 V. In the same manner as in Example 1 except for the change, a first dielectric material layer, a second dielectric material layer, a third dielectric material layer and a transparent electrode layer were sequentially formed, and the transparent electrode layer was then patterned and a heat-treatment was performed.

Example 11

In the same manner as in Example 10, except that a target having a tin oxide content of 10% by weight was used as a target for the deposition of the transparent electrode layer, a first dielectric material layer, a second dielectric material layer, a third dielectric material layer and a transparent electrode layer were sequentially formed, and the transparent electrode layer was then patterned and a heat-treatment was performed.

Example 12

In the same manner as in Example 10 except that the transparent electrode layer was formed to have a thickness of 30 nm, a first dielectric material layer, a second dielectric material layer, a third dielectric material layer and a transparent electrode layer were sequentially formed, and the transparent electrode layer was then patterned and a heat-treatment was performed.

Comparative Example 4

In the same manner as in Example 10 except that that a target having a tin oxide content of 3% by weight was used for the deposition of the transparent electrode layer, a first dielectric material layer, a second dielectric material layer, a third dielectric material layer and a transparent electrode layer were sequentially formed, and the transparent electrode layer was then patterned and a heat-treatment was performed. The transmittance in the electrode layer-formed part of the substrate with a transparent electrode layer of Comparative Example 4 was 87.2%.

Example 13 and Comparative Examples 5 to 8

By adjusting the introduced amount of argon and oxygen during deposition, the device internal pressure during deposition of the first dielectric material layer and the third dielectric material layer was changed as shown in Table 1. In the same manner as in Example 10 except for the change, a first dielectric material layer, a second dielectric material layer, a third dielectric material layer and a transparent electrode layer were sequentially formed, and the transparent electrode layer was then patterned and a heat-treatment was performed.

In Example 10 (deposition pressure for forming the first dielectric material layer and the third dielectric material layer: 0.2 Pa), Example 13 (deposition pressure for forming the first dielectric material layer and the third dielectric material layer: 0.3 Pa), Comparative Example 5 (deposition pressure for forming the first dielectric material layer and the third dielectric material layer: 0.5 Pa) and Comparative Example 6 (deposition pressure for forming the first dielectric material layer and the third dielectric material layer: 0.8 Pa), the arithmetic mean roughness of the third dielectric material layer was 0.5 nm, 0.7 nm, 1.3 nm and 4.5 nm, respectively. Comparing Examples 10 and 13 and Comparative Examples 5 and 6, it is apparent that the surface becomes smoother as the deposition pressure for forming the third dielectric material layer decreases.

Example 14

Sputtering was performed while the relative ratio of oxygen in the introduced gas during deposition of the first dielectric material layer was reduced. The obtained $SiO_x$ layer had a thickness of 5 nm and a refractive index of 1.75. In the same manner as in Example 10 except for the change, a first dielectric material layer, a second dielectric material layer, a third dielectric material layer and a transparent electrode layer were sequentially formed, and the transparent electrode layer was then patterned and a heat-treatment was performed.

Comparative Example 9

In the same manner as in Example 14 except that the first dielectric material layer was formed to have a thickness of 30 nm, a first dielectric material layer, a second dielectric material layer, a third dielectric material layer and a transparent electrode layer were sequentially formed, and the transparent electrode layer was then patterned and a heat-treatment was performed.

Example 15

By changing a permanent magnet to be attached to the sputtering device, the magnetic flux density in the deposition of the transparent electrode layer was adjusted to 76 mT. The voltage of the MF power source during the sputtering deposition was 306 V. In the same manner as in Example 8 except for the change, a first dielectric material layer, a second dielectric material layer, a third dielectric material layer and a transparent electrode layer were sequentially formed, and the transparent electrode layer was then patterned and a heat-treatment was performed. The transmittance of the electrode layer-formed part of the substrate with a transparent electrode in Example 15 was 89.4%.

Comparative Example 10

A middle-refractive-index transparent dielectric material layer (first dielectric material layer) was not formed, and a high-refractive-index transparent dielectric material layer (second dielectric material layer) consisting of niobium oxide was formed directly on one of the surfaces of a biaxially oriented PET film. A low-refractive-index dielectric material layer (third dielectric material layer) consisting of silicon oxide ($SiO_2$) and a transparent electrode layer were sequentially formed thereon in the same manner as in Example 10, followed by patterning and heat-treating of the transparent electrode layer.

The refractive index and thickness and deposition conditions for the formation of each layer, the resistivity and sheet resistance of the transparent electrode layer, and the results of the visual evaluation of the substrate with a transparent electrode in the Examples and Comparative Examples described above are shown in Table 1. In all Examples and Comparative Examples, the refractive index of the second dielectric material layer was 2.18 and the refractive index of the third dielectric material layer was 1.47.

TABLE 1

| | Deposition Conditions | | | | | | ITO | | | ITO Film Properties | | | Pattern Visibility | | |
| | SiOx | | | | SiOy | | Magnetic Flux Density (mT) | $SnO_2$ Content (wt %) | Thickness (nm) | | Resistivity ($\times 10^{-4}$ $\Omega \cdot cm$) | Sheet Resistance $\Omega$/sq | Crease Visual Inspection | Transmitted Light Visual Inspection | Reflected Light Visual Inspection |
| | $n_1$ | $d_1$ (nm) | Deposition Pressure (Pa) | $Nb_2O_5$ $d_2$ (nm) | $d_3$ (nm) | Deposition Pressure (Pa) | | | | $n_4$ | | | | | |
|---|---|---|---|---|---|---|---|---|---|---|---|---|---|---|---|
| Example 1 | 1.65 | 5 | 0.2 | 7 | 50 | 0.2 | 46 | 5 | 25 | 1.84 | 3.3 | 131 | 4 | 3 | 5 |
| Comparative Example 1 | 1.65 | 5 | 0.2 | 4 | 50 | 0.2 | 46 | 5 | 25 | 1.84 | 3.3 | 133 | 4 | 2 | 2 |
| Example 2 | 1.65 | 5 | 0.2 | 6 | 50 | 0.2 | 46 | 5 | 25 | 1.84 | 3.3 | 132 | 4 | 4 | 5 |
| Example 3 | 1.65 | 5 | 0.2 | 8 | 50 | 0.2 | 46 | 5 | 25 | 1.84 | 3.3 | 130 | 4 | 4 | 4 |
| Example 4 | 1.65 | 5 | 0.2 | 9 | 50 | 0.2 | 46 | 5 | 25 | 1.84 | 3.4 | 134 | 4 | 3 | 3 |
| Comparative Example 2 | 1.65 | 5 | 0.2 | 10 | 50 | 0.2 | 46 | 5 | 25 | 1.84 | 3.2 | 129 | 4 | 2 | 2 |
| Comparative Example 3 | 1.65 | 5 | 0.2 | 7 | 30 | 0.2 | 46 | 5 | 25 | 1.84 | 3.3 | 130 | 3 | 2 | 2 |
| Example 5 | 1.65 | 5 | 0.2 | 7 | 40 | 0.2 | 46 | 5 | 25 | 1.84 | 3.3 | 131 | 4 | 4 | 4 |
| Example 6 | 1.65 | 5 | 0.2 | 7 | 45 | 0.2 | 46 | 5 | 25 | 1.84 | 3.3 | 133 | 4 | 4 | 5 |
| Example 7 | 1.65 | 5 | 0.2 | 7 | 55 | 0.2 | 46 | 5 | 25 | 1.84 | 3.3 | 132 | 4 | 4 | 4 |
| Example 8 | 1.65 | 5 | 0.2 | 6 | 60 | 0.2 | 46 | 5 | 24 | 1.86 | 3.5 | 146 | 5 | 3 | 4 |
| Example 9 | 1.65 | 5 | 0.2 | 7 | 65 | 0.2 | 46 | 5 | 25 | 1.84 | 3.3 | 131 | 5 | 3 | 3 |
| Example 10 | 1.65 | 5 | 0.2 | 7 | 50 | 0.2 | 16 | 5 | 25 | 1.85 | 5.0 | 201 | 3 | 4 | 4 |
| Example 11 | 1.65 | 5 | 0.2 | 7 | 50 | 0.2 | 16 | 10 | 25 | 1.82 | 3.0 | 120 | 3 | 4 | 5 |
| Example 12 | 1.65 | 5 | 0.2 | 7 | 50 | 0.2 | 16 | 10 | 30 | 1.81 | 2.7 | 90 | 3 | 3 | 5 |
| Comparative Example 4 | 1.65 | 5 | 0.2 | 7 | 50 | 0.2 | 16 | 3 | 25 | 2.00 | 7.9 | 314 | 2 | 3 | 2 |
| Example 13 | 1.65 | 5 | 0.3 | 7 | 50 | 0.3 | 16 | 5 | 25 | 1.88 | 5.0 | 200 | 3 | 4 | 4 |

TABLE 1-continued

| | | Deposition Conditions | | | | | | | | | | | Pattern Visibility | | |
|---|---|---|---|---|---|---|---|---|---|---|---|---|---|---|---|
| | | SiOx | | Nb$_2$O$_5$ | SiOy | | ITO | | | ITO Film Properties | | | | Transmitted | Reflected |
| | | | | | | | Magnetic | | | | | | Crease | Light | Light |
| | | | Deposition | | | Deposition | Flux | SnO$_2$ | | | Resistivity | Sheet Resistance | Visual | Visual | Visual |
| | | d$_1$ | Pressure | d$_2$ | d$_3$ | Pressure | Density | Content | Thickness | | (×10$^{-4}$ | Ω/ | Inspection | Inspection | Inspection |
| | n$_1$ | (nm) | (Pa) | (nm) | (nm) | (Pa) | (mT) | (wt %) | (nm) | n$_4$ | Ω · cm) | sq | | | |
| Comparative Example 5 | 1.65 | 5 | 0.5 | 7 | 50 | 0.5 | 16 | 5 | 25 | 1.92 | 5.5 | 220 | 1 | 3 | 3 |
| Comparative Example 6 | 1.65 | 5 | 0.8 | 7 | 50 | 0.8 | 16 | 5 | 25 | 1.94 | 7.0 | 280 | 1 | 3 | 2 |
| Comparative Example 7 | 1.65 | 5 | 0.3 | 7 | 50 | 0.5 | 16 | 5 | 25 | 1.91 | 5.3 | 210 | 1 | 3 | 3 |
| Comparative Example 8 | 1.65 | 5 | 0.5 | 7 | 50 | 0.3 | 16 | 5 | 25 | 1.90 | 5.1 | 205 | 1 | 3 | 3 |
| Example 14 | 1.75 | 5 | 0.2 | 7 | 50 | 0.2 | 16 | 5 | 25 | 1.85 | 4.5 | 180 | 3 | 5 | 5 |
| Comparative Example 9 | 1.75 | 30 | 0.2 | 7 | 50 | 0.2 | 16 | 5 | 25 | 1.85 | 4.5 | 180 | 3 | 1 | 1 |
| Example 15 | 1.65 | 5 | 0.2 | 6 | 60 | 0.2 | 76 | 5 | 23 | 1.86 | 3.5 | 150 | 5 | 4 | 5 |
| Comparative Example 10 | — | — | — | 7 | 50 | 0.2 | 16 | 5 | 25 | 1.85 | 5.0 | 199 | 2 | 4 | 4 |

From Table 1, it is apparent that, in the substrate with a transparent electrode in the Examples of the present invention, the generation of pattern creases is inhibited, the color difference of transmitted light and reflected light between the electrode layer-formed part and the electrode layer-non-formed part is small, so that the pattern of the transparent electrode layer is hardly visible.

Comparing Examples 1 to 4 and Comparative Examples 1 and 2, it is apparent that, when the thickness of the second dielectric material layer falls within a specific range, the color difference of transmitted light and reflected light is reduced, so that the pattern of the transparent electrode layer is hardly visible.

In Comparative Example 3 where the thickness of the third dielectric material layer was small, there was a large color difference between an electrode layer-formed part and an electrode layer-non-formed part and the pattern was visible for both reflected light and transmitted light. On the other hand, in Example 8 where the thickness of the third dielectric material layer was 60 nm and Example 9 where the thickness of the third dielectric material layer was 65 nm, the generation of creases was further inhibited, so that a substrate with a transparent electrode in which the pattern was hardly visible was obtained. From these results, it can be said that, when the thickness of the third dielectric material layer present just below the transparent electrode layer is increased, the generation of pattern creases tends to be inhibited.

Comparing Examples 9 to 11 and Comparative Example 4, it is apparent that, when the content of tin oxide in ITO is high, the transparent electrode layer has a reduced resistance and a reduced refractive index, and the generation of pattern creases is inhibited. From these results, the content of tin oxide in ITO may be preferably 4% or more for inhibiting the generation of pattern creases.

Comparing Examples 10 and 13 and Comparative Examples 5 to 8, it is apparent that, when the pressure for the deposition of the third dielectric material layer is decreased, the surface of the third dielectric material layer becomes smooth, so that the transparent electrode layer formed thereon has a reduced resistivity and a reduced refractive index, and the generation of pattern creases is inhibited.

Comparing between Comparative Example 5 and Comparative Example 7, the former and the latter are different only in the deposition pressure for forming the first dielectric material layer, and are identical in the deposition conditions for the formation of the third dielectric material layer and the deposition conditions for the formation of the transparent electrode layer. In the transparent electrode layer of Comparative Example 5, the resistance and refractive index are low as compared to the transparent electrode layer of Comparative Example 7, and the generation of pattern creases is suppressed. Comparison between Example 13 and Comparative Example 8 shows a similar tendency. From these results, it is considered that not only the third dielectric material layer, but also the first dielectric material layer contributes to the reduction of the resistance of the transparent electrode layer and the inhibition of the generation of pattern creases.

In Comparative Example 10, where the first dielectric material layer was not formed, and the second dielectric material layer was formed directly on the substrate, the color difference between the electrode layer-formed part and the electrode layer-non-formed part was small, but creases along the pattern of the transparent electrode layer were significant, so that the pattern was easily visible.

In Comparative Example 9, where the thickness of the first dielectric material layer was 30 nm, the generation of creases was inhibited, but there was a large color difference of transmitted light and reflected light between the electrode layer-formed part and the electrode layer-non-formed part, and the pattern was visible.

Comparison between Example 1 and Example 10 shows that, by enhancing the magnetic flux density during the deposition of the transparent electrode layer, the transparent electrode layer had a reduced resistance, and the generation of pattern creases tended to be inhibited.

Reference Examples 1 to 8

In Reference Examples 1 to 8 below, a substrate with a transparent electrode was manufactured while the configuration of a dielectric material layer and the magnetic flux density during the deposition of a transparent electrode layer were changed for further examining a relationship between the magnetic flux density during the deposition of the transparent electrode layer and film characteristics.

In Reference Example 1, a high-refractive-index transparent dielectric material layer (second dielectric material layer) consisting of niobium oxide was formed directly on one of the surfaces of a biaxially oriented PET film, and a transparent electrode layer was formed thereon. In Reference Examples 2 to 5, a low-refractive-index transparent dielectric material layer (third dielectric material layer) consisting of $SiO_2$ was formed directly on one of the surfaces of a biaxially oriented PET film, and a transparent electrode layer was formed thereon. In Reference Example 5, a target having a tin oxide content of 10% by weight was used during the deposition of the transparent electrode layer. In Reference Examples 6 to 8, a dielectric material layer was not formed, and a transparent electrode layer was formed directly on one of the surfaces of a biaxially oriented PET film.

In Reference Examples 1 to 8, the transparent electrode layer was patterned and a heat-treatment was performed similarly to the Examples and Comparative Examples described above. In Reference Example 5, where the content of tin oxide in the transparent electrode was 10% by weight, the transparent electrode layer was not crystallized even after the heat treatment.

The refractive index and thickness and conditions for the formation of each layer, and the resistivity, sheet resistance, average grain size of crystals and variation coefficient of the crystal grain sizes of the transparent electrode layer in the substrates with a transparent electrode in Reference Examples 1 to 8 are shown in Table 2. Results of the evaluation of pattern creases, and the transmittance and b* of the electrode layer-formed part (non-etched part) in the substrates with a transparent electrode are shown in Table 2. In Table 2, results of the evaluation of the substrates with a transparent electrode in Examples 1, 8 and 15 are also shown. Microscope observation photographs of the transparent electrode layers in Reference Example 2 and Reference Example 3 are shown in FIG. 2 and FIG. 3, respectively.

TABLE 2

| | Deposition Conditions | | | | | | ITO Film Properties | | | | | | Pattern Visibility | | | Electrode layer formed part | |
|---|---|---|---|---|---|---|---|---|---|---|---|---|---|---|---|---|---|
| | | | | ITO | | | Crystal Grain | | Conductivity | | | | | | | | |
| | $SiOx$ $d_1$ (nm) | $Nb_2O_5$ $d_2$ (nm) | $SiOy$ $d_3$ (nm) | Magnetic Flux Density (mT) | $SnO_2$ content (wt %) | Thickness (nm) | Average Grain Size (nm) | Variation Coefficient | Resistivity ($\times 10^{-4}$ $\Omega \cdot cm$) | Sheet Resistance ($\Omega$/sq) | Carrier Density ($\times 10^{20}$/cm³) | | crease Visual Inspection | transmitted light Visual Inspection | Reflected light Visual Inspection | Transparency (%) | b* |
| Example 1 | 5 | 7 | 50 | 46 | 5 | 25 | 210 | 0.52 | 3.3 | 131 | 6.5 | | 4 | 3 | 5 | 88.6 | 1.49 |
| Example 8 | 5 | 6 | 60 | 46 | 5 | 24 | 200 | 0.44 | 3.5 | 146 | 7.5 | | 5 | 3 | 4 | 88.8 | 1.79 |
| Example 15 | 5 | 6 | 60 | 76 | 5 | 23 | 300 | 0.42 | 3.5 | 150 | 6.5 | | 5 | 4 | 5 | 89.4 | 1.45 |
| Reference Example 1 | — | 7 | — | 46 | 5 | 25 | 240 | 0.49 | 3.3 | 131 | 6.3 | | 4 | 1 | 1 | 82.8 | 4.14 |
| Reference Example 2 | — | — | 50 | 16 | 5 | 25 | 110 | 0.23 | 5.1 | 205 | 4.5 | | 2 | 1 | 1 | 85.7 | 3.73 |
| Reference Example 3 | — | — | 50 | 46 | 5 | 25 | 250 | 0.48 | 3.2 | 128 | 6.8 | | 4 | 1 | 1 | 86.8 | 3.55 |
| Reference Example 4 | — | — | 50 | 76 | 5 | 25 | 310 | 0.46 | 3.3 | 133 | 6.3 | | 4 | 1 | 1 | 87.9 | 2.80 |
| Reference Example 5 | — | — | 50 | 16 | 10 | 25 | amorphous | amorphous | 5.1 | 205 | 7.0 | | 2 | 1 | 1 | 84.2 | 8.23 |
| Reference Example 6 | — | — | — | 16 | 5 | 25 | 90 | 0.12 | 7.7 | 307 | 3.8 | | 1 | 1 | 1 | 81.9 | 5.01 |
| Reference Example 7 | — | — | — | 46 | 5 | 25 | 80 | 0.15 | 6.0 | 238 | 4.2 | | 1 | 1 | 1 | 83.9 | 4.16 |
| Reference Example 8 | — | — | — | 76 | 5 | 25 | 90 | 0.14 | 7.5 | 298 | 3.8 | | 1 | 1 | 1 | 83.1 | 4.31 |

Comparison between Example 8 and Example 15 and comparison among Reference Examples 2 to 4 show that, by enhancing the magnetic flux density in deposition of the ITO transparent electrode layer on the dielectric material layer consisting of silicon oxide, the generation of pattern creases was inhibited, and a transparent electrode layer having a high transmittance and low b* was obtained. Particularly, in Example 8 and Example 15 where the thickness of the third dielectric material layer was 60 nm, by enhancing the magnetic flux density during the deposition of the transparent electrode layer, the color difference between the electrode layer-formed part and the electrode layer-non-formed part was reduced for both transmitted light and reflected light, so that a substrate with a transparent electrode in which the pattern of the transparent electrode layer was hardly visible was obtained.

From the results in Table 2, it is apparent that, by enhancing the magnetic flux density during deposition, the transparent electrode layer tends to have a reduced resistance, and a transparent electrode layer having a low resistivity of $3.7 \times 10^{-4} \Omega \cdot cm$ or less is obtained.

Comparison between Reference Example 2 and Reference Example 3 shows that, by enhancing the magnetic flux density during deposition, the average grain size of crystals in the transparent electrode layer is increased, and the variation coefficient of the average grain size is increased. It is considered that such crystal properties may contribute to reducing the resistance of the transparent electrode layer. In Reference Example 4, the magnetic flux density is enhanced to 76 mT, so that the average crystal grain size increases as compared to Reference Example 3. However, there was no significant difference in the variation coefficient, and there was almost no difference in resistivity between Reference Example 3 and Reference Example 4. From this result, it is considered that, not only the average grain size of crystal grains, but also the variation coefficient contributes to the reduction of the resistivity.

In Reference Examples 6 to 8, where the transparent dielectric material layer was not formed, even when the magnetic flux density was enhanced, the crystal grain size and the variation coefficient of the crystal grain size were not increased, and the resistivity was not reduced. In Reference Examples 6 to 8, pattern creases were not reduced, even when the magnetic flux density during deposition of the transparent electrode layer was enhanced.

In Reference Examples 6 to 8, where the transparent electrode layer was formed directly on the transparent film, even when the magnetic flux density during deposition of the transparent electrode layer was enhanced, there was no significant difference in the crystal grain size of the transparent electrode layer, and the inhibition of pattern creases and reduction of the resistance were not achieved.

The above results show that, when an ITO film is formed with a specific magnetic flux density on the dielectric material layer of the transparent film substrate, the grain size of the heated and crystallized ITO film and the variation coefficient of the grain size are increased, so that the transparent electrode layer has a reduced resistance, and the generation of pattern creases tends to be inhibited. That is, not only when the dielectric material layer has a three-layer structure, but also when an ITO film is formed with a specific magnetic flux density on the transparent film substrate including a transparent dielectric material layer containing an oxide as a main component, the transparent electrode layer has a reduced resistance, and pattern creases of the transparent electrode layer tend to be inhibited.

Particularly, when the transparent dielectric material layer includes three layers: a silicon oxide middle-refractive-index layer (first dielectric material layer), a metal oxide high-refractive-index layer (second dielectric material layer) and a silicon oxide low-refractive-index layer (third dielectric material layer), each having a specific thickness as in Examples 1, 8 and 15, by forming the transparent electrode layer with a specific magnetic flux density on the transparent dielectric material layer, pattern creases of the transparent electrode layer are reduced, and the transmittance of the electrode layer-formed part is increased to reduce a reflected light color difference and a transmitted light color difference between the electrode layer-formed part and the electrode layer-non-formed part, so that pattern visibility tends to be further suppressed. Particularly, when the thickness of the third dielectric material layer is more than 55 nm, the effect of suppressing pattern visibility is remarkable.

DESCRIPTION OF REFERENCE CHARACTERS 1 transparent film
2 dielectric material layer
21 first dielectric material layer
22 second dielectric material layer
23 third dielectric material layer
10 transparent film base
4 transparent electrode
4a electrode layer-formed part (non-etched part)
4b electrode layer-non-formed part (etched part)
100 substrate with transparent electrode

The invention claimed is:

1. A substrate with a transparent electrode, comprising: a transparent film; and a first dielectric material layer, a second dielectric material layer, a third dielectric material layer, and a transparent electrode layer patterned into an electrode layer-formed part and an electrode layer-non-formed part, in this order on at least one surface of the transparent film, wherein the first dielectric material layer is a silicon oxide layer containing $SiO_x$ ($x \geq 1.5$) as a main component and having a thickness of 1 nm to 25 nm, the second dielectric material layer is a metal oxide layer containing as a main component at least one oxide of a metal selected from the group consisting of Nb, Ta, Ti, Zr, Zn and Hf and having a thickness of 5 nm or more and less than 10 nm, the third dielectric material layer is a silicon oxide layer containing $SiO_y$ ($y > x$) as a main component and having a thickness of 35 nm to 80 nm, the transparent electrode layer is a conductive metal oxide layer containing an indium-tin composite oxide as a main component and having a thickness of 20 nm to 35nm, and the indium-tin composite oxide has an average crystal grain size of 200 nm to 700 nm and a crystal grain size variation coefficient of 0.35 or more, a refractive index $n_1$ of the first dielectric material layer, a refractive index $n_2$ of the second dielectric material layer and a refractive index $n_3$ of the third dielectric material layer satisfy a relationship of $n_3 < n_1 < n_2$, the transparent electrode layer has a resistivity of $5.0 \times 10^{-4}$ Ω·cm or less, and the electrode layer-formed part of the substrate with transparent electrode has a transmittance of 87% or more.

2. The substrate with a transparent electrode according to claim 1, wherein the transparent electrode layer has a refractive index $n_4$ of 1.88 or less.

3. The substrate with a transparent electrode according to claim 1, wherein a refractive index $n_4$ of the transparent electrode layer is larger than the refractive index $n_1$ of the first dielectric material layer, and smaller than the refractive index $n_2$ of the second dielectric material layer.

4. The substrate with a transparent electrode according to claim 1, wherein the transparent electrode layer has a resistivity of $3.7 \times 10^{-4}$ Ω·cm or less.

5. The substrate with a transparent electrode according to claim 1, wherein an arithmetic mean roughness of the third dielectric material layer is 1 nm or less.

6. The substrate with a transparent electrode according to claim 1, wherein the second dielectric material layer is a metal oxide layer containing $Nb_2O_5$ as a main component.

7. The substrate with a transparent electrode according to claim 1, wherein the transparent electrode layer has a carrier density of $6.1 \times 10^{20}/cm^3$ or more.

8. The substrate with a transparent electrode according to claim 1, wherein the transparent electrode layer contains tin oxide in an amount of 4 parts by weight to 14 parts by weight based on 100 parts by weight of a sum of indium oxide and tin oxide.

9. The substrate with a transparent electrode according to claim 1, wherein the thickness of the third dielectric material layer is more than 55 nm and not more than 80 nm.

10. A substrate with a transparent electrode, comprising: a transparent film; and a dielectric material layer containing an oxide as a main component and a transparent electrode layer patterned into an electrode layer-formed part and an electrode layer-non-formed part, in this order, on at least one surface of the transparent film, wherein
> the transparent electrode layer is a conductive metal oxide layer containing an indium-tin composite oxide as a main component and having a thickness of 20 nm to 35 nm, and a resistivity of the transparent electrode layer is $5.0 \times 10^{-4}$ Ω·cm or less, and
>
> an indium-tin composite oxide in the transparent electrode layer has an average crystal grain size of 200 nm to 700 nm and a crystal grain size variation coefficient of 0.35 or more.

* * * * *

UNITED STATES PATENT AND TRADEMARK OFFICE
CERTIFICATE OF CORRECTION

PATENT NO. : 9,696,751 B2  
APPLICATION NO. : 14/401495  
DATED : July 4, 2017  
INVENTOR(S) : Hiroaki Ueda, Kozo Kondo and Kazuhisa Danno Page 1 of 1

It is certified that error appears in the above-identified patent and that said Letters Patent is hereby corrected as shown below:

On the Title Page

In Item (57) Abstract, Line 10, delete "$SiO_v$" and insert --$SiO_y$--.

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*